(12) United States Patent
Troiani et al.

(10) Patent No.: US 10,097,908 B2
(45) Date of Patent: Oct. 9, 2018

(54) DC-COUPLED LASER DRIVER WITH AC-COUPLED TERMINATION ELEMENT

(71) Applicant: MACOM Technology Solutions Holdings, Inc., Lowell, MA (US)

(72) Inventors: Matteo Troiani, Irvine, CA (US); Cristiano Bazzani, Irvine, CA (US); Yanxin Will Wang, San Marcos, CA (US); Kevin McDonald, Portland, OR (US); Atul Gupta, Aliso Viejo, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 250 days.

(21) Appl. No.: 14/588,267

(22) Filed: Dec. 31, 2014

(65) Prior Publication Data

US 2016/0191196 A1    Jun. 30, 2016

(51) Int. Cl.
*H04B 10/50* (2013.01)
*H04Q 11/00* (2006.01)

(52) U.S. Cl.
CPC ....... *H04Q 11/0066* (2013.01); *H04B 10/502* (2013.01); *H04B 10/504* (2013.01);
(Continued)

(58) Field of Classification Search
CPC ................ H04J 14/08; H04Q 11/0066; H04Q 2011/0033; H04Q 2011/0086; H04Q 2011/0035; H04B 10/502; H04B 10/504
(Continued)

(56) References Cited

U.S. PATENT DOCUMENTS 4,488,305 A * 12/1984 Claverie ............. H01S 5/06825
372/38.01
4,534,064 A   8/1985 Giacometti et al.
(Continued)

FOREIGN PATENT DOCUMENTS

EP     0606161    4/2000
EP     1471671    12/2004
(Continued)

OTHER PUBLICATIONS

Analog Devices, Background information about wireless communications. Date unknown, http://rf.rfglobalnet.com/library/applicationnotes/files/7/bginfo.htm , 8 pages.
(Continued)

*Primary Examiner* — Ken N Vanderpuye
*Assistant Examiner* — Dibson Sanchez
(74) *Attorney, Agent, or Firm* — Weide & Miller, Ltd.

(57) ABSTRACT

An optical signal module including a driver and an optical signal module. The driver includes a differential pair configured to receive and process an input signal to create a drive signal. A modulation current source provides a modulation current to the differential pair. One or more termination resistors connected to the differential pair for impedance matching. A first switch, responsive to a first control signal, maintains charge on a charge storage device. The optical signal module includes an optical signal generator arranged between a supply voltage node and a bias current node. The optical signal generator receives the drive signal and generates an optical signal representing the input signal. A second switch is between a supply voltage node the bias current node. The second switch, responsive to second control signal, selectively establishes a short between the supply voltage node the bias current node.

15 Claims, 5 Drawing Sheets

(52) U.S. Cl.
CPC ......... *H04Q 2011/0033* (2013.01); *H04Q 2011/0035* (2013.01); *H04Q 2011/0086* (2013.01)

(58) Field of Classification Search
USPC .................................................. 398/182–201
See application file for complete search history.

(56) References Cited

U.S. PATENT DOCUMENTS

| | | |
|---|---|---|
| 4,545,078 A | 10/1985 | Wiedeburg |
| 4,687,937 A | 8/1987 | Aagano et al. |
| 4,709,416 A | 11/1987 | Patterson |
| 4,734,914 A | 3/1988 | Yoshikawa |
| 4,747,091 A | 5/1988 | Doi |
| 4,864,649 A | 9/1989 | Tajima et al. |
| 5,019,769 A | 5/1991 | Levinson |
| 5,039,194 A | 8/1991 | Block et al. |
| 5,057,932 A | 10/1991 | Lang |
| 5,334,826 A | 8/1994 | Sato et al. |
| 5,383,046 A | 1/1995 | Tomofuji et al. |
| 5,383,208 A | 1/1995 | Queniat et al. |
| 5,392,273 A | 2/1995 | Masaki et al. |
| 5,394,416 A | 2/1995 | Ries |
| 5,396,059 A | 3/1995 | Yeates |
| 5,448,629 A | 9/1995 | Bosch et al. |
| 5,471,501 A | 11/1995 | Parr et al. |
| 5,488,627 A | 1/1996 | Hardin et al. |
| 5,491,548 A | 2/1996 | Bell et al. |
| 5,510,924 A | 4/1996 | Terui et al. |
| 5,532,471 A | 7/1996 | Khorramabadi et al. |
| 5,557,437 A | 9/1996 | Sakai et al. |
| 5,574,435 A | 11/1996 | Mochizuki |
| 5,594,748 A | 1/1997 | Jabr |
| 5,636,254 A | 6/1997 | Hase et al. |
| 5,673,282 A | 9/1997 | Wurst |
| 5,710,660 A | 1/1998 | Yamamoto et al. |
| 5,812,572 A | 9/1998 | King et al. |
| 5,822,099 A | 10/1998 | Takamatsu |
| 5,831,959 A * | 11/1998 | Sakanushi ............... H01S 5/042 372/25 |
| 5,844,928 A | 12/1998 | Shastri et al. |
| 5,900,959 A | 5/1999 | Noda et al. |
| 5,912,694 A * | 6/1999 | Miyake .................. B41J 2/471 372/38.01 |
| 5,926,303 A | 7/1999 | Giebel et al. |
| 5,943,152 A | 8/1999 | Mizrahi et al. |
| 5,953,690 A | 9/1999 | Lemon et al. |
| 5,956,168 A | 9/1999 | Levinson et al. |
| 5,978,393 A | 11/1999 | Feldman et al. |
| 6,010,538 A | 1/2000 | Sun et al. |
| 6,014,241 A | 1/2000 | Winter et al. |
| 6,020,593 A | 2/2000 | Chow et al. |
| 6,021,947 A | 2/2000 | Swartz |
| 6,023,147 A | 2/2000 | Cargin, Jr. et al. |
| 6,049,413 A | 4/2000 | Taylor et al. |
| 6,064,501 A | 5/2000 | Roberts et al. |
| 6,081,362 A | 6/2000 | Hatakeyama et al. |
| 6,108,113 A | 8/2000 | Fee |
| 6,111,687 A | 8/2000 | Tammela |
| 6,115,113 A | 9/2000 | Flockencier |
| H1881 H | 10/2000 | Davis et al. |
| 6,160,647 A | 12/2000 | Gilliland et al. |
| 6,175,434 B1 | 1/2001 | Feng |
| 6,259,293 B1 | 7/2001 | Hayase et al. |
| 6,262,781 B1 | 7/2001 | Deter |
| 6,282,017 B1 | 8/2001 | Kinoshita |
| 6,292,497 B1 | 9/2001 | Nakano |
| 6,333,895 B1 | 12/2001 | Hamamoto et al. |
| 6,366,373 B1 | 4/2002 | MacKinnon et al. |
| 6,397,090 B1 | 5/2002 | Cho |
| 6,423,963 B1 | 7/2002 | Wu |
| 6,452,719 B2 | 9/2002 | Kinoshita |
| 6,473,224 B2 | 10/2002 | Dugan et al. |
| 6,494,370 B1 | 12/2002 | Sanchez |
| 6,504,857 B1 * | 1/2003 | Iwazaki ................ H01S 5/0021 372/38.02 |
| 6,512,617 B1 | 1/2003 | Tanji et al. |
| 6,535,187 B1 | 3/2003 | Wood |
| 6,556,601 B2 | 4/2003 | Nagata |
| 6,563,848 B1 * | 5/2003 | Iwazaki ................ H01S 5/042 372/31 |
| 6,570,944 B2 | 5/2003 | Best et al. |
| 6,580,328 B2 | 6/2003 | Tan et al. |
| 6,597,485 B1 * | 7/2003 | Ikeuchi ................ H04B 10/504 372/29.011 |
| 6,657,488 B1 | 12/2003 | King et al. |
| 6,661,940 B2 | 12/2003 | Kim |
| 6,704,008 B2 | 3/2004 | Naito et al. |
| 6,707,600 B1 | 3/2004 | Dijaili et al. |
| 6,720,826 B2 | 4/2004 | Yoon |
| 6,740,864 B1 | 5/2004 | Dries |
| 6,801,555 B1 | 10/2004 | Dijaili et al. |
| 6,828,857 B2 | 12/2004 | Paillet et al. |
| 6,836,493 B2 | 12/2004 | Mahowald et al. |
| 6,837,625 B2 | 1/2005 | Schott et al. |
| 6,852,966 B1 | 2/2005 | Douma et al. |
| 6,862,047 B2 | 3/2005 | Hibi |
| 6,864,751 B1 | 3/2005 | Schmidt et al. |
| 6,868,104 B2 | 3/2005 | Stewart et al. |
| 6,879,217 B2 | 4/2005 | Visocchi |
| 6,888,123 B2 | 5/2005 | Douma et al. |
| 6,909,731 B2 | 6/2005 | Lu |
| 6,934,307 B2 | 8/2005 | DeCusatis et al. |
| 6,934,479 B2 | 8/2005 | Sakamoto et al. |
| 6,941,077 B2 | 9/2005 | Aronson et al. |
| 6,952,531 B2 | 10/2005 | Aronson et al. |
| 6,956,643 B2 | 10/2005 | Farr et al. |
| 6,957,021 B2 | 10/2005 | Aronson et al. |
| 6,967,320 B2 | 11/2005 | Chieng et al. |
| 7,005,901 B1 | 2/2006 | Jiang et al. |
| 7,031,574 B2 | 4/2006 | Huang et al. |
| 7,039,082 B2 | 5/2006 | Stewart et al. |
| 7,046,721 B2 | 5/2006 | Grohn |
| 7,049,759 B2 | 5/2006 | Roach |
| 7,050,720 B2 | 5/2006 | Aronson et al. |
| 7,058,310 B2 | 6/2006 | Aronson et al. |
| 7,065,114 B2 * | 6/2006 | Hishiyama ........... G11B 7/1263 372/29.011 |
| 7,066,746 B1 | 6/2006 | Togami et al. |
| 7,079,775 B2 | 7/2006 | Aronson et al. |
| 7,127,391 B2 | 10/2006 | Chang et al. |
| 7,181,100 B2 * | 2/2007 | Douma ................ H01S 5/042 385/14 |
| 7,184,671 B2 | 2/2007 | Wang |
| 7,193,957 B2 | 3/2007 | Masui et al. |
| 7,206,023 B2 | 4/2007 | Belliveau |
| 7,215,891 B1 | 5/2007 | Chiang et al. |
| 7,233,206 B2 | 6/2007 | Murakami et al. |
| 7,265,334 B2 | 9/2007 | Draper et al. |
| 7,276,682 B2 | 10/2007 | Draper et al. |
| 7,357,513 B2 | 4/2008 | Watson et al. |
| 7,381,935 B2 | 6/2008 | Sada et al. |
| 7,400,662 B2 * | 7/2008 | Robinson ............. H01S 5/0014 372/29.01 |
| 7,403,064 B2 | 7/2008 | Chou et al. |
| 7,453,475 B2 | 11/2008 | Nitta et al. |
| 7,504,610 B2 | 3/2009 | Draper |
| 7,741,908 B2 | 6/2010 | Furuta |
| 8,094,692 B2 * | 1/2012 | Nakamura ........... G02F 1/0123 372/26 |
| 8,548,336 B2 * | 10/2013 | Nuttgens ............ H04B 10/504 398/197 |
| 9,419,410 B2 * | 8/2016 | Usuki .................. H01S 5/042 |
| 2001/0046243 A | 1/2001 | Schie |
| 2002/0015305 A1 | 2/2002 | Bornhorst et al. |
| 2002/0085600 A1 * | 7/2002 | Jung .................... H01S 5/0427 372/38.02 |
| 2002/0105982 A1 | 8/2002 | Chin et al. |
| 2002/0130977 A1 | 9/2002 | Hibi |
| 2002/0140378 A1 | 10/2002 | Volk et al. |
| 2003/0030756 A1 | 2/2003 | Kane et al. |
| 2003/0043869 A1 | 3/2003 | Vaughan |

(56) References Cited

U.S. PATENT DOCUMENTS

| | | | |
|---|---|---|---|
| 2003/0053003 A1 | 3/2003 | Nishi et al. | |
| 2003/0067662 A1 | 4/2003 | Brewer et al. | |
| 2003/0122057 A1 | 7/2003 | Han et al. | |
| 2004/0032890 A1 | 2/2004 | Murata | |
| 2004/0047635 A1 | 3/2004 | Aronson et al. | |
| 2004/0095976 A1 | 5/2004 | Bowler et al. | |
| 2004/0114650 A1* | 6/2004 | Tanaka | H01S 5/042 372/38.02 |
| 2004/0136727 A1 | 7/2004 | Androni et al. | |
| 2004/0160996 A1* | 8/2004 | Giorgi | H01S 5/042 372/25 |
| 2004/0202215 A1 | 10/2004 | Fairgrieve | |
| 2004/0240041 A1 | 12/2004 | Tian et al. | |
| 2005/0024142 A1 | 2/2005 | Sowlati | |
| 2005/0062530 A1 | 3/2005 | Bardsley et al. | |
| 2005/0141576 A1* | 6/2005 | Ikeda | H01S 5/06835 372/38.02 |
| 2005/0180280 A1 | 8/2005 | Hoshino et al. | |
| 2005/0185149 A1 | 8/2005 | Lurkens et al. | |
| 2005/0215090 A1 | 9/2005 | Harwood | |
| 2005/0243879 A1* | 11/2005 | Horiuchi | H01S 5/042 372/38.07 |
| 2006/0114954 A1 | 6/2006 | Wong et al. | |
| 2006/0125557 A1 | 6/2006 | Manstretta | |
| 2006/0192899 A1 | 8/2006 | Ogita | |
| 2006/0239308 A1 | 10/2006 | Husain | |
| 2006/0261893 A1 | 11/2006 | Chiang et al. | |
| 2006/0280211 A1* | 12/2006 | Garez | H01S 5/06832 372/38.01 |
| 2007/0047602 A1* | 3/2007 | Tanaka | H01S 5/042 372/29.014 |
| 2007/0058089 A1 | 3/2007 | Wang | |
| 2007/0081130 A1 | 4/2007 | May et al. | |
| 2007/0098026 A1 | 5/2007 | Uesaka et al. | |
| 2007/0159434 A1 | 7/2007 | Yen et al. | |
| 2007/0195208 A1 | 8/2007 | Miyazawa et al. | |
| 2007/0229718 A1 | 10/2007 | Hall | |
| 2007/0263685 A1* | 11/2007 | Takasou | H01S 5/042 372/38.02 |
| 2007/0286609 A1 | 12/2007 | Ikram et al. | |
| 2008/0012508 A1 | 1/2008 | Steele et al. | |
| 2008/0024469 A1 | 1/2008 | Damera-Venkata et al. | |
| 2008/0055005 A1 | 3/2008 | Nam et al. | |
| 2008/0074562 A1 | 3/2008 | Endo et al. | |
| 2008/0231209 A1 | 9/2008 | Shiwaya et al. | |
| 2008/0246893 A1 | 10/2008 | Boss et al. | |
| 2008/0303499 A1 | 12/2008 | Chen et al. | |
| 2008/0309407 A1 | 12/2008 | Nakamura et al. | |
| 2009/0238226 A1* | 9/2009 | Moto | H01S 5/042 372/38.02 |
| 2010/0164396 A1 | 7/2010 | Lindeberg et al. | |
| 2010/0172384 A1* | 7/2010 | Groepl | H05B 33/0818 372/38.04 |
| 2010/0183318 A1* | 7/2010 | Tanaka | H04B 10/504 398/201 |
| 2011/0062874 A1 | 3/2011 | Knapp | |
| 2014/0023374 A1* | 1/2014 | Yuda | H01S 5/0427 398/98 |
| 2014/0226147 A1* | 8/2014 | Metzler | H01S 5/0428 356/5.01 |
| 2014/0233594 A1 | 8/2014 | Kubo | |

FOREIGN PATENT DOCUMENTS

| | | |
|---|---|---|
| JP | 2015-152660 | 8/1993 |
| JP | 2001-119250 | 4/2001 |
| JP | 2004/045989 | 2/2004 |
| WO | WO 93/21706 | 10/1993 |
| WO | WO 02/063800 | 8/2002 |
| WO | WO 2004/098100 | 11/2004 |

OTHER PUBLICATIONS

A Low Noise, Wide Dynamic Range, Transimpedance Amplifier with Automatic Gain Control for SDH/SONET (STM16/OC48) in a 30GHz ft BiCMOS Process, Mihai A. T., Sanduleanu, Philips Research Eindhoven, Paul Manteman, Philips Semiconductors Nijmegen, Sep. 19, 2001, 19 pages.

"PLL Design", http://members.innet.net.au/~richardh/PPH.htm, 9pages.

"LCT3454-1A Synchronous Buck-Boost High Current LED Driver" Linear Technology, http://www.linear.com/product/LTC3454 @Linear Technology, 12 pages.

Garth Nash, "AN535 Application Notes-Phase-Locked Loop Design Fundamentals", Motorola, Inc., 1994, 3 pages.

Jamie Bailey "How DVD Works", http://sweb.uky.edu/~jrbai101/dvd.htm, May 1, 1999, pages.

Tuan "Solace" Nguyen, "CD, CD-R, CD-RW, DVD, DD-RAM, DVD-RW, and MO", Tweak3D.Net-Your Freakin' Tweakin Source!, http://www.tweak3d.net/articles/opticals/, May 13, 2000, 7 pages.

"An Introduction to DVD-RW", DVD White Paper, Pioneer New Media Technologies, Inc., Feb. 8, 2001, 8 pages.

Ron Bertrand, "The Basics of PLL Frequency Synthesis", Online Radio & Electronics Course, Apr. 2002, 9 pages.

Richard Wilkinson "Topic: Selecting the Right DVD Mastering Technique", DVD Technology Update, http://www.optical-disc.com/dvdupdate.html, 2002, 8 pages.

Dr. John Rilum, "Mastering Beyond DVD Density", http://www.optical-disc.com/beyonddvd.html, 2002, 7 pages.

"CD Basics: The Bumps", Howstuffworks "How CD Burners Work", http://entertainment.howstuffworks.com/cd-burner1.htm, 2004, 3 pages.

Keith Szolusha, "Linear Technology Design Notes DC/DC Converter Drives Lumileds White LEDs from a Variety of Power Sources—Design Note 340", Linear Technology Corporation, © Linear Technology Corporation 2004, date unknown, 2 pages.

"An Introduction to DVD Recordable (DVD-R) What is DVD Recordable?" http://www.dvd-copy.com/reference/dvd_recordable.html, 2004, 8 pages.

"Power Management, LED-driver considerations" Analog and Mixed-Signal Products, Analog Applications Journal, www.ti.com/sc/analogapps, Texas Instruments Incorporated, © 2005 Texas Instruments Incorporated, Michael Day, 5 pages.

"Linear Technology LCT 3533 2A Wide Input Voltage Synchronous Buck-Boost DC/DC Converter", © Linear Technology Corporation 2007, 16 pages.

"National Semiconductor LM 3549 High Power Sequential LED Driver", © 2010 National Semiconductor Corporation, www.national.com, Aug. 3, 2010, 20 pages.

"TPS63020 TPS63021 High Efficiency Single Inductor Buck-Boost Converter With 4-A Switches", Texas Instruments, Copyright © 2010, Texas Instruments Incorporated, Apr. 2010, 28 pages.

"LT3476—High Current Quad Output LED Driver" Linear Technology, http://www.linear.com/product/LT3476, @2010 Linear Technology, 14 pages.

"Current mirror" Wikipedia, the free encyclopedia, http://en.wikipedia.org/wiki/Current_mirror, May 22, 2011, 8 pages.

"Mosfet" Wikipedia, the free encyclopedia, http://en.wikipedia.org/wiki/MOSFET, May 27, 2011, 24 pages.

Abhijit Phanse, National Semiconductor, "Exercise 2: Define the time variance of a fiber optic channel's Impulse Response, and suggest a method for measuring it", IEEE 802.3ae, 11/00, 13 pages.

* cited by examiner

DC-COUPLED LASER DRIVER WITH AC-COUPLED TERMINATION ELEMENT

FIELD OF THE INVENTION

The invention relates to laser drivers and in particular to a laser driver with improved response time and reduced power consumption.

RELATED ART

The use of optical devices in electronic system is common and widespread. The optical devices may include laser or LED for use in communication systems, projection systems, or optical media readers and writers. To improve performance and increase product life while decreasing power consumption and heat generation, it is preferred to reduce the response time of the driver and also reduce power consumption.

One type of light source driver is a DC-coupled laser driver. This type of laser driver may benefit from near end termination elements to reduce reflection when driving 25-ohm transmission lines such as for example, a TOSA (transmitter optical sub-assembly) in high data rate applications. Different application may be established with different termination resistances. Failure to properly terminate will result in signal reflections due to impedance mismatch, which limit system operation.

In a typical configuration, the light source, such as a laser device includes a cathode terminal and an anode terminal. The cathode termination resistor, which connects to the cathode terminal and to a high voltage, creates a current path for laser bias current which may be sourced by a bias current driver. Therefore, some portion of the bias current is wasted in the termination resistor. This is undesirable in all applications, but in system which rely on battery power for operation, is highly undesirable.

In addition, many applications require a rapid response time for both laser on time and laser off time. One such application is burst mode communication systems which assign timeslots to various users of a shared optical cable and then each user transmits in bursts during their assigned time slot. As can be appreciated, rapid response time allows an assigned user to begin transmitting sooner and terminate transmission faster, during their assigned time slot, translates to higher effective data rates during the time slot. Therefore, there is a need in the art to reduce burst-on time and burst-off time.

SUMMARY

To overcome the drawbacks of the prior art and provide additional benefits, an optical signal module including a driver is disclosed. The driver includes a differential pair with a first transistor configured to receive a first input signal and a second transistor configured to receive a second input signal. The first signal and the second signal being a differential input signal such that the differential pair is configured to supply a first drive signal and a second drive signal in response to the first input signal and the second input signal. A modulation current source provides a modulation current to the differential pair and one or more termination elements, such as resistors, connected to the differential pair. A first switch, responsive to a first control signal, has a first terminal and a second terminal such that the first terminal connects to at least one of the one or more termination elements. A charge storage device is also part of this embodiment and is connected to the second terminal of the first switch and a supply voltage node. In other embodiments, differential pair may be replaced with a singled ended modulation circuit. The termination element may be one or more inductors, capacitors, resistors, active devices (such as in the case of active termination) or any other impedance matching element. The termination element may be referred to herein as a termination resistor.

The optical module includes an optical signal generator arranged between the supply voltage node and a bias current node. The optical signal generator receives the first drive signal and a second drive signal to generate an optical signal representing the first input signal and the second input signal. A second switch is configured between a supply voltage node and the bias current node such that the second switch is responsive to second control signal and is configured to establish a short between the supply voltage node the bias current node. The first switch and/or second switch can by any device or element that creates an open circuit or blocks current flow.

In one embodiment the module further comprises a first inductor located between the optical signal generator and the supply voltage node and a second inductor located between the optical signal generator and the bias current node. In one configuration, the optical signal generator is a laser diode.

The first control signal and second control signal may be generated by a controller responsive to a burst-on signal or a burst-off signal. Responsive to a burst-on signal, the second control signal opens the second switch and thereafter the first control signal closes the first switch. In one configuration responsive to a burst-off signal, the first control signal opens with first switch to thereby maintain charge on the charge storage device, and thereafter the second control signal closes the second switch. A cascade transistor may be located between one of the termination elements and the differential pair.

Also disclosed is an optical signal generator module including a driver. The module comprises a driver configured to process at least one input signal to generate a drive signal. A first switch is located between a supply voltage node and the differential pair and the first switch is responsive to a first control signal. A charge storage device is located between the supply voltage node and the first switch. An optical signal generator receives the drive signal, and responsive to the drive signal, generates an optical signal. A second switch is associated with the optical signal generator. The second switch is responsive to a second control signal to selectively short voltage across the optical signal generator through the switch. One or more termination elements are also provided and selected to impedance match the driver with the optical signal generator, the one or more termination elements located between the supply voltage node and the driver mirror.

In one embodiment, at least one input signal is a differential input signal. The charge storage device may comprise a capacitor. The module may include a controller configured to generate the first control signal and the second control signal, such that when the optical signal generator is active the first switch is closed and the second switch is open, and when the optical signal generator is inactive the first switch is open and the second switch is closed. In one embodiment, when the optic signal generator is transitioning to an active state, the second switch is opened before the first switch is closed and when the optical signal generator is transitioning to an inactive state, the first switch is opened before the second switch is closed.

Also disclosed herein is a method for driving an optical signal generator with a driver. The optical signal generator and driver include a driver configured to amplify at least one input signal, a first switch located between a supply voltage node and the driver such that the first switch is responsive to an activation control signal and a de-activation control signal. A charge storage device is also present and is located between the supply voltage node and the first switch. An optical signal generator receives the drive signal and responsive to the drive signal generates an optical signal while a second switch that is associated with the optical signal generator, is responsive to the activation control signal and the de-activation control signal to selectively short voltage across the optical signal generator through the switch. In operation, the system receives a one or more input signals and also receives a supply voltage from a supply voltage node. Then receiving an activation signal to initiate a transmit period for the optical signal generator and responsive to the activation signal, generating the activation control signal. The method of operation then provides the activation control signal to the second switch to open the second switch and then provides the activation control signal to the first switch to close the first switch. The system also amplifies the input signal with the driver to generate a drive signal representative of the input signal. Thereafter, the system receives a de-activation signal to terminate a transmit period for the optical signal generator and responsive to the de-activation signal, generate the de-activation control signal. The system provides the de-activation control signal to the first switch to open the first switch and provides the de-activation control signal to the second switch to close the second switch.

In one embodiment, the activation signal initiates a transmit period or a burst-on period. Responsive to the activation control signal, the second switch may be opened before the first switch is closed. Responsive to the de-activation control signal the first switch may be opened before the second switch is closed.

In one configuration, the one or more input signals comprises two input signals presented as a differential pair. The method may also include impedance matching the driver to the optical signal generator with one or more termination elements such that the one or more termination elements located between the supply voltage node and the driver or as part of the driver. In one exemplary method of operation, closing the second switch shorts voltage across the optical signal generator, thereby terminating optical signal generation. Opening the first switch maintains charge on the charge storage device during periods when the optical signal generator is not generating an optical signal.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

To overcome the drawbacks of the prior art and to provide additional benefits, an optical signal driver is disclosed that includes a charge storage device and a unified switching system to maintain charge on the charge storage device during transmit and non-transmit periods, such as in a time multiplexed environment.

Figure 1:
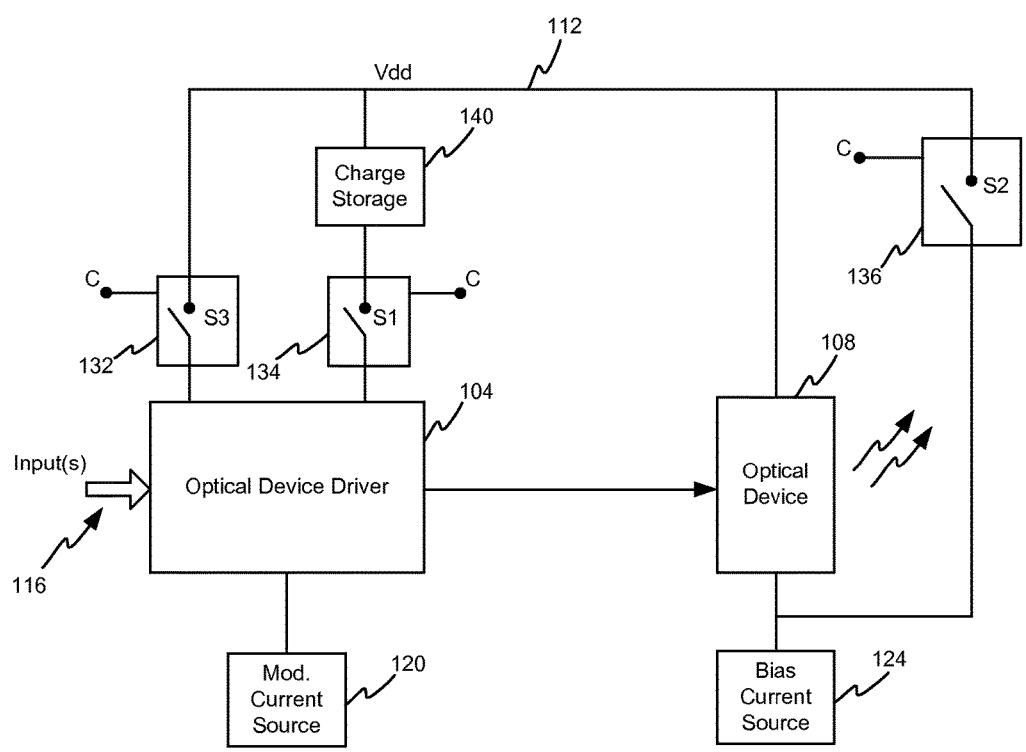
FIG. 1 is a block diagram illustrating an exemplary light source driver with unified switching and a charge storage device to reduce power consumption and improve response time.

FIG. 1 is a block diagram illustrating an exemplary light source driver with unified switching and a charge storage device to reduce power consumption and improve response time. This is one possible configuration and as such it is contemplated that other embodiments which utilize a charge storage device in connection with one or more switching elements maybe developed which do not depart from the claims that follow.

In this exemplary embodiment, an optical device driver 104 connects to or is in communication with an optical device 108. The driver 104 may be any arrangement of active and/or passive devices configured to receive and process an input signal into a drive signal capable of driving the optical device 108 to thereby generate an optical signal as shown. The optical device driver 104 may be configured to include one or more impedance matching devices or networks to match the impedance at the input 116, such as from a pre-driver impedance, and at the output to the optical device 108. Impedance matching devices may include one or more resistors, inductors, capacitors, active devices, or a combination of one or more of those devices. Proper impedance matching insures maximum signal transfer and reduced reflection, which in turn result in improved performance and higher effective bandwidth and data transfer rates.

The optical device may comprise any device capable of generating an optical signal including but not limited to one or more lasers, LED, optical modulator or any other type of optical signal generator or conditioner, with or without flex or any embedded trace. The applications or operating environment for the system of FIG. 1 could be an optical communication system, projection systems, optical media read/write applications such as CD, DVD, and Blu-ray, or any other application or environment which utilizes an optical signal.

An input signal is provided to the optical device driver 104 through one or more input ports 116. The input to the driver 104 may be single ended or a differential pair, or it may assume any other format or number of inputs.

A modulation current source 120 provides a modulation current and a bias current to the optical device driver 104 as shown while a bias current source 124 provides a bias current to the optical device 108. In this environment, modulation current sources 120 and bias current source 124 are known elements and as such, these devices are not discussed in detail. In one embodiment, the driver 104 is includes two elements, one that provides modulating electrical signal to the optical device 108 and another that provides biasing current to the optical device.

A supply voltage node Vdd 112 is shown at the top of FIG. 1 as establishing a supply voltage to the system. Connected to the supply voltage node 112 is the optical device 108 and three switches, referred to herein as switch S3 132, switch S1 134, and switch S2 136. Switch S3 132 connects to the voltage supply node 112 and the optical device driver 104. Switch S2 136 connects to the voltage supply node 112 and a node on the opposing terminal of the optical device 108, such as the node between the bias current source 124 and the optical device. Switch S1 connects between a charge storage device 140 and the driver 104. Any of the switches S1, S2, and S3 may be made to be in an open condition (open circuit) or a closed condition (short circuit) and one of ordinary skill in the art would understand that each switch may be selectively opened or closed based on the control signal.

The switches may be any type switch, either passive or active, and may be controlled by one or more control signals, shown as inputs C to the switch modules 132, 134, 136. The switch control signals (C) determine the switch positions as discussed below in general and in particular in FIG. 3. The switch control signals are responsive to or controlled by one or more other signals in the optical transmit module and may be generated directly from these signals are processed by a controller or processor. In one embodiment, the switch control signals, which open and close the switches, are responsive to burst-on mode and burst-off mode, or transmit on and transmit off signals.

The switch S3 132 is optional, but is included in this embodiment to prevent or cut off any leakage to the optical device during burst off periods.

A charge storage device 140 also connects to the supply voltage node 112 and the switch S1 134. The charge storage device may be any device that stores or supplements charge including but not limited to a capacitor, active device such as transistor, FET, MOSFET, or any active circuit. In one embodiment the charge storage device also blocks DC current from passing between the supply voltage node 112 and the optical driver when the switch S1 134 is closed.

In operation, the input signal(s) is presented to the driver 104 on input 116. The driver processes the signal to establish the signal at a magnitude (voltage, current) suitable for driving the optical device to generate an optical signal. In one embodiment, the input is a modulated signal containing signal data. The supply voltage is provided from node 112. During active transmit sessions, the switch S1 is closed in response to the switch control signal causing the charge storage device to become charged and store charge, while also acting to block DC current from flowing from the supply node 112 to the optical signal driver. During the transmit period (or active period) for the optical device 108, the switch S2 is open, to allow the driver signal to drive the optical device.

In this exemplary embodiment, the supply voltage Vdd voltage shown in FIG. 2 can be a supply voltage or can be controlled by a regulator. In the event the voltage is sourced or controlled by a regulator, there are two solutions. First, a regulator may be configured to establish voltage Vdd close to a target value voltage. The target voltage can be selected by the user. Second, a feedback loop may be provided that is configured to sense the DC voltage (the frequency components much lower than data frequency) on OUTP terminal (connect point between driver module and optical module) and set the Vdd voltage in order to keep the OUTP DC voltage close to a target value. The target can be selected by the user.

Immediately after or close in time after the end of the transmit period (end of the burst-on period), the switch S1 134 is first opened, and thereafter switch S2 136 is closed. The opening of switch S1 should not interfere with the burst on transmit period. The time between switch S1 134 opening and switch S2 136 may be of a short duration. Opening switch S1 134 prior to the closing of switch S2 136 results in the charge storage device 140 maintaining storage of the charge established during the transmit period. Charge is maintained on the storage device 140 because the switch creates an open circuit in the discharge path for the charge storage device to ground. Closing of the switch S2 136 rapidly thereafter eliminates any voltage differential across the optical device thereby rapidly terminating emission of light energy.

Maintaining the charge on the charge storage device 140 improves performance by establishing a fast response time when re-establishing optical signal generation during a subsequent transmit period. Absent the charge maintained on the charge storage device 140, at the start of a subsequent transmit session there would be a delay to charge the capacitor or other circuit elements before transmission begins. Establishing the charge storage device as a blocking element or open circuit to DC current reduces power consumption by not providing current into the termination. This configuration may be referred to as AC coupled termination.

At the beginning of a subsequent transmit period, when an optical signal is to be generated, the switch S2 136 opens and thereafter the switch S1 134 closes and optical signal generation commences.

Turning now to FIG. 2, a circuit diagram is shown for an exemplary laser driver configured with switching elements and charge storage device for increasing response time and decreasing power consumption. This is but one possible circuit configuration and other arrangements are contemplated that also include the novel and beneficial aspects of this circuit as discussed below. In addition, not all elements and aspects of the circuit are shown as would be understood by one of ordinary skill in the art.

In this example embodiment, the circuit may be divided for purposes of discussion into several separate sub-systems, each of which are discussed below. This embodiment includes an optical module 256 (which may include additional elements not shown), a driver module 212, termination elements, shown in this embodiment as termination resistors 216A, 216B, a switching system defined by a controller 220, and switches 222, 224, 225, and a capacitor 240. Each sub-system is discussed below.

The optical module includes the optical signal generator 256. A first and second inductor 250, 252 connect to the optical signal generator 256 as shown. The optical signal generator 256 generates the optical signal and may comprise one or more lasers, LEDs, or any other element that generates an optical signal.

In this embodiment, the optical signal generator 256 include a cathode terminal 260 and an anode terminal 258. The anode terminal of the optical signal generator connects to a supply voltage node 242 through the inductor 250. At the cathode terminal 260, the optical signal generator 256 connects to the inductor 252, which in turn connects to a switch 225 and a bias current source 268 as shown.

In this embodiment, the inductors 250, 252 are included to account for the time constant of the circuit created by the closing of switch S2 225. The inductors affect the time constant of the burst on/burst off transition. As discussed above, switch S1 is closed after switch S2, and after the system is settled. Thus, there are two aspects to consider. First, during burst off, switch S2 shunts impedances which causes the time constant to be small, or of short duration, since the series resistance of the circuit is also small due to the switch S2. Thus, the time constant is minimized since switch S2 resistance is small. Second, for the transition to burst on mode, it is important to time the operation of switch S2 and switch S1 so that switch S1 is closed only after the current and voltage of the optical branch are settled after the switch S2 is opened. Thus, the controller is configured to incorporate a timing or delay function to close switch S1 after settling of the circuit according to the time constant which prevents switch S1 from closing immediately after switch S2. The amount of time may be fixed or programmable, such as through a user interface accessible through the timer of controller. The amount of time depends on the value of the inductors L1 & L2.

In an alternative embodiment, the controller or other element may be made to monitor the voltage on node 260 and then detect when the circuit is settled, at which time switch S1 can be closed. Such an embodiment may include a feedback component or a detector. The monitoring may occur at the node 260 which is defined by the letter M. Inductor L1 252 also shields the optical signal generator 256 from the capacitance of the current bias source 268.

A drive signal is provided to the optical signal generator 256 from the driver 212. In this embodiment, the driver 212 includes three transistors Q1 276, Q2 272, Q3 274. In other embodiments, active devices other than transistor may be used. Transistors Q1 270 and Q2 272 are arranged as a differential stage or as a differential pair with the emitter terminal connected to a modulation current source 278. In other embodiments, the differential pair may be configured as or replaced with an emitter follower generator, current mirror, a modulation circuit, or any circuit providing modulated signal to the optical signal generator. In addition, although shown as a differential pair, the driver could be configured as singled ended.

The base terminals of the transistors Q1 270 and Q2 272 receive input modulation signals, which may be considered as the inputs to the driver, and which control the output of the optical signal generator 256. The driver inputs provided to the base terminals of transistors Q1, Q2 270, 272 may arrive from a pre-driver circuit or other element depending on the application.

Figure 2A:
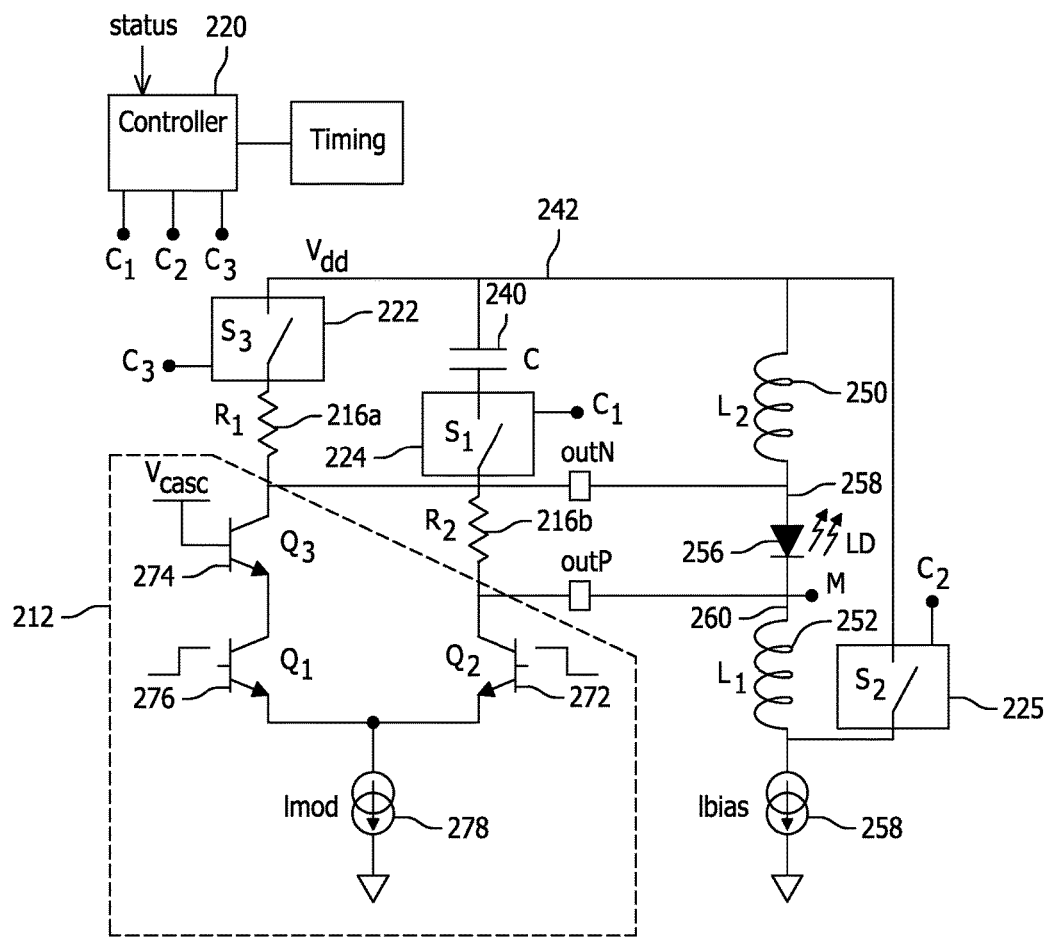
FIG. 2A is a circuit diagram illustrating an exemplary laser driver configured with switching elements and charge storage device for increasing response time and decreasing power consumption.

The collector terminal of transistor Q1 270 connects to transistor Q3 274 as shown. The base of transistor Q3 is presented with a cascade voltage Vcasc to avoid breakdown of transistor Q1 270 which may result due to the signal on node outN being too large and also to balance bias voltage of the transistor Q1 270 and transistor Q2 272 which may occur due to voltage mismatch between outP and outN. The collector terminal of transistor Q3 274 connects to a termination resistor 216A. The collector terminal of transistor Q2 272 connects to a termination resistor 216B as shown. Although FIG. 2A is shown with bipolar transistors it is possible that any other semiconductor technology, such as CMOS/GaAs/InP can be used.

The termination resistors 216A, 216B are provided and selected to impedance or resistance match the optical signal generators 256 (or to match any trace between the optical signal generator 256 and the driver) to prevent reflections and maximize energy transfer to the optical signal generator 256. In one embodiment, the resistance R2 216B is set to 25 ohms to match a 25 ohm optical signal generator 256. The purpose and selection of the termination resistors 216A, 216B are discussed below in greater detail.

The opposing terminal of resistor R1 216A connects to a switch S3 222 and the opposing terminal of the switch S3 222 connects to the supply voltage node 242. The switch S3 222 also receives a control signal C3 from a controller 220. The control signal determines the position of the switch S3 222, such as open or closed.

The second terminal of the resistor R2 216B connects to switch S1 224 as shown and the opposing terminal of the switch S1 connects to a capacitor 240. The switch S1 224 also receives a control signal C1 from the controller 220 such that the control signal determine the open/close status of the switch. The opposing terminal of the switch S1 224 connects to capacitor 240, which in turn connects to the voltage supply node 242 as shown.

The switch S2 225 is connected between a node formed by the inductor 252 and the bias current source 258, and at an opposing terminal to the supply voltage node 242. The switch S2 225 receives a control input C2 which controls the switch position between an open and closed position. The switch S2 225 shorts the voltage across the light source 256 to rapidly prevent light output during burst-off periods. In other embodiments, the switch S2 may be replaced with any device configured to steer the bias current and the modulation current away from the laser during burst-off periods. For example, in an alternative embodiment a differential stage may be used, but such an embodiment would be more costly and complex.

The controller 220 may comprise any type controller including but not limited to control logic, ASIC, processor, delay, state machine, or any combination thereof. The controller 220 receives and processes a status input to generate the one or more control signals C1, C2, C3 provided to the switches. In one embodiment, the status input comprises information regarding whether the driver and light source is in burst-on mode or burst-off mode. It is contemplated that one or more control signal(s) may be delayed relative to other control signals.

In operation, the circuit of FIG. 2 operates as follows. Modulation signals, which define the signal to be generated as an optical signal, presented to the base nodes of transistor 270, 272 as differential signals. These signals are presented at the collector node of the transistor 270, 272 and presented to the light source to drive the light source. Termination resistors R1, R2 216A, 216B are provided for impedance matching between the driver 212 and the light source 256. The termination resistors may be referred to as termination elements. The capacitor 240 is provided to allow AC current flow from the supply voltage node 242 to the outP node of the driver, while blocking DC coupling. Modulation current source 278 provides current to the driver while bias current source 268 provides the current through the light source 256. During operation, the switches S1, S2, S3 224, 225, 222 are selectively controlled as discussed in FIG. 3.

During burst off, any configuration or element can be employed that prevents device current from going into the optical module, such as the laser 256. The switches S1, S2 are shown for enablement and understanding. Thus, any device that, when the bias is active, shunts bias current to the supply to keep it away from the laser can be employed for the reasons stated herein. In one or more embodiments, this could be a switch, or a diff. pair, any active device, such as a FET or transistor, or any other device or means to turn off the bias modulation. The purpose of such as device is to establish the bias, which is a constant current to the laser, when in burst off, to rapidly be effectively zero current to laser. In certain example environments of use, such a TDM system, any current leakage causes the laser to pollute the fiber, which in turn reduces the SNR for other users. Using this innovation, the system is able to maintain the bias on, but use the switch (or other element) to rapidly shunt the current away from the laser to keep the laser off. It is also contemplated that the Ibias current 258 could be turned off as a way to prevent current from being presented to the optical module. This applies to both the bias current and modulation current. Thus, any circuit may be used to block the current into the laser, for instance any circuit that steers the current (both modulation and bias) away from the driver or any circuit that turns off both modulation and bias source.

Figure 2B:
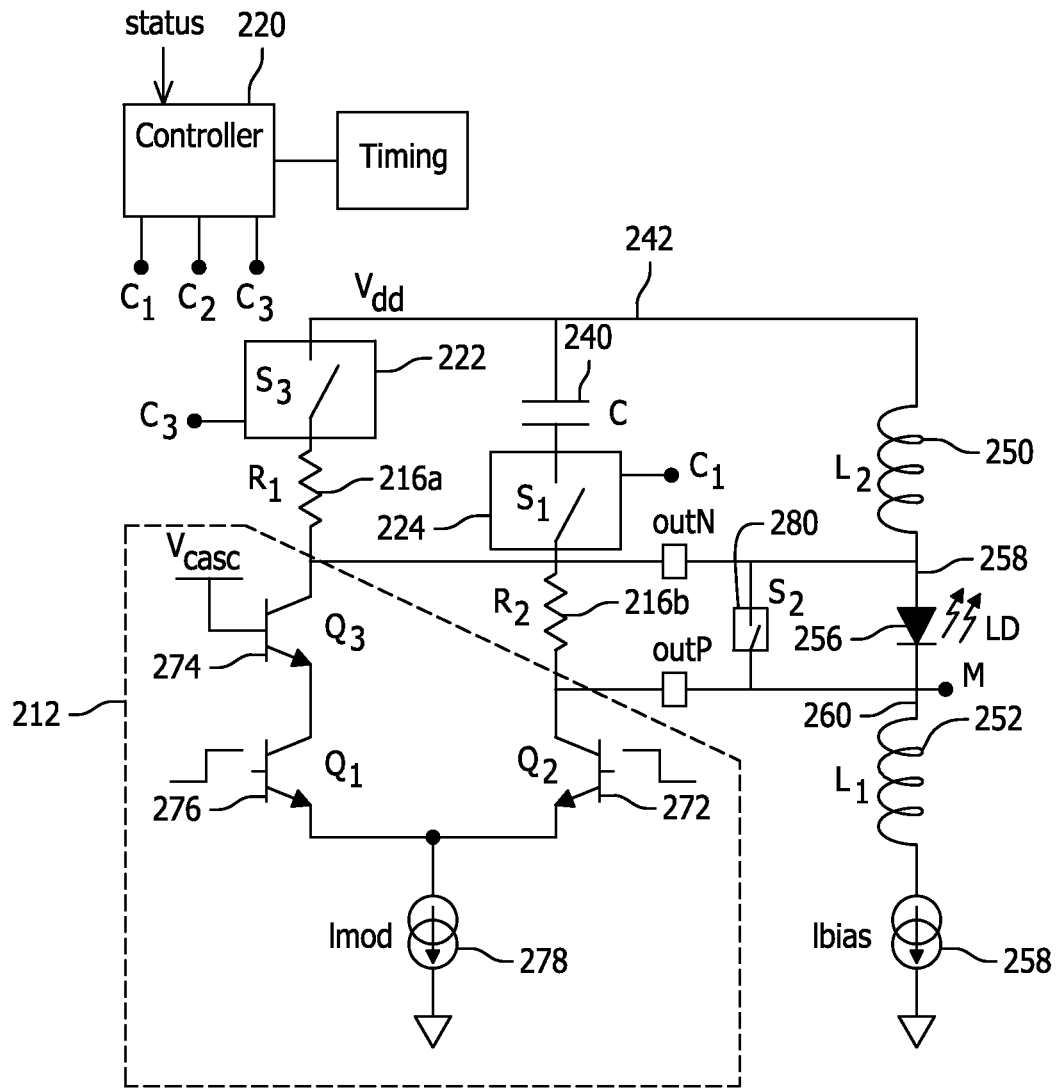
FIG. 2B is a circuit diagram illustrating an exemplary driver circuit with an alternative switch arraignment.

FIG. 2B is a circuit diagram illustrating an exemplary driver circuit with an alternative switch arraignment. As compared to FIG. 2A identical elements are identified with identical reference numbers. In this embodiment, a second switch S2 280 is located across the outN node and the outP node a shown. By placing the switch S2 in this location, the current and voltage across the optical signal generator 256 may be rapidly shunted upon closing of the switch S2. Operation of this embodiment is generally similar to the operation of the embodiment of FIG. 2A.

Figure 2C:
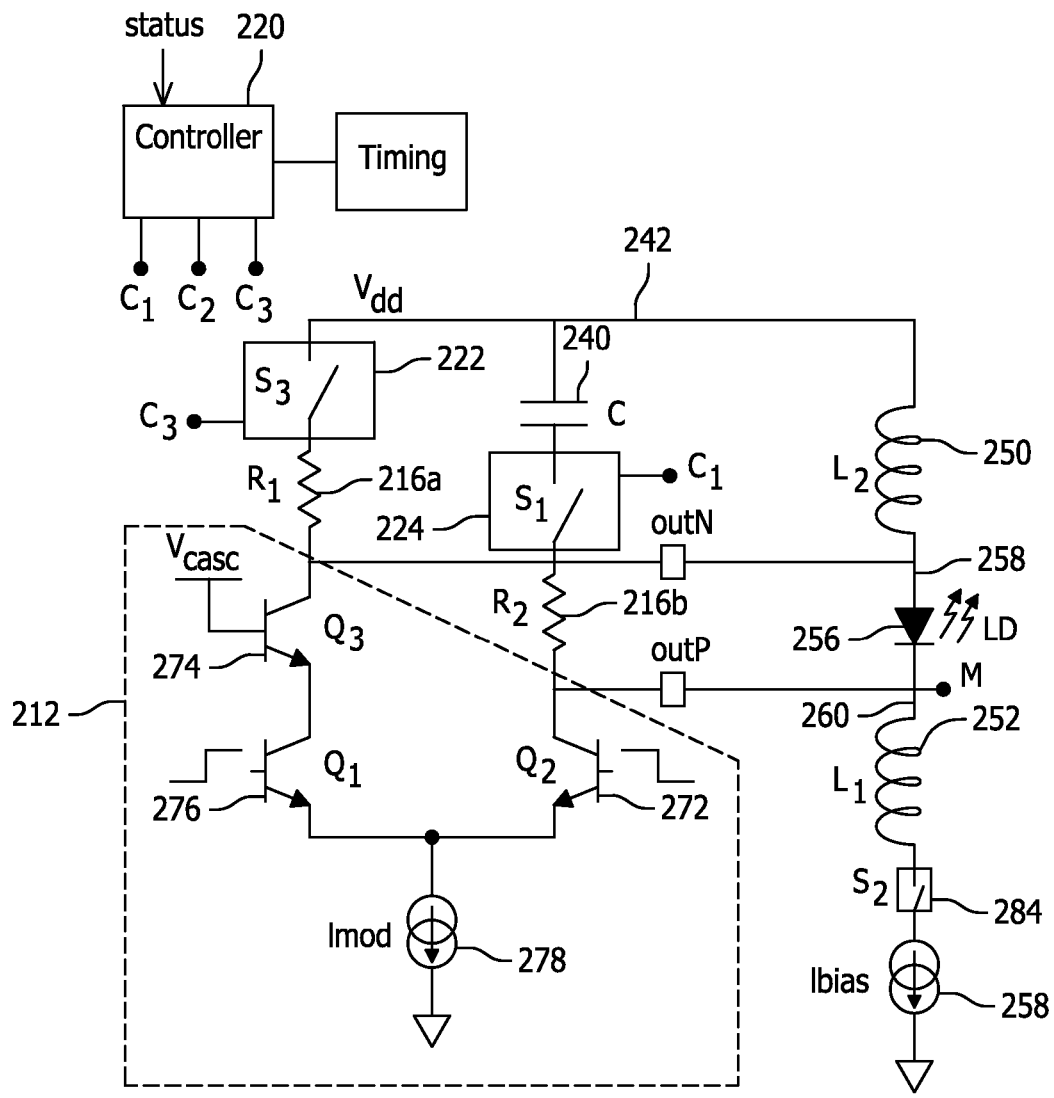
FIG. 2C is a circuit diagram illustrating an exemplary driver circuit with an alternative switch arraignment.

FIG. 2C is a circuit diagram illustrating an exemplary driver circuit with an alternative switch arraignment. As compared to FIG. 2A identical elements are identified with identical reference numbers. In this embodiment, a second switch S2 284 is located between the Ibias current source 258 and inductor L1 252. In other related embodiments, the switch S2 284 could be series connected at any location in the path between node 242 and the current source 258 to interrupt operation of the optical signal generator 256. By placing the switch S2 284 in this location, the current through the optical signal generator 256 may be rapidly ceased upon opening of the switch S2. Operation of this embodiment is generally similar to the operation of the embodiment of FIG. 2A, except that the opening of switch S2 stops transmission from the optical signal generator.

Figure 3:
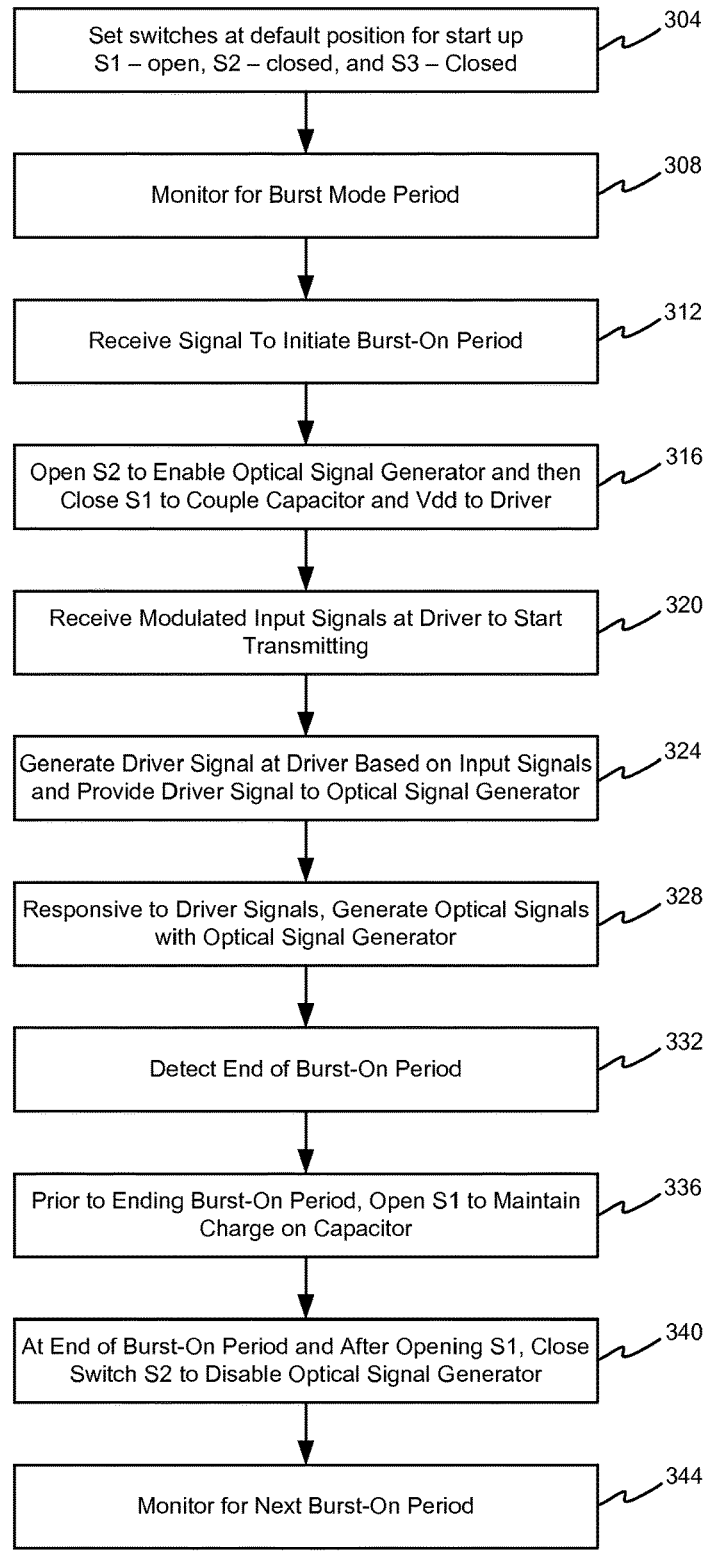
FIG. 3 is an operational flow diagram of an exemplary method of operation.

FIG. 3 is an operational flow diagram of an exemplary protocol for switch control and driver operation. Discussion of the operation of the system of FIG. 2 begins when the circuit is initially in an off state, or a burst off mode. It is also assumed that the capacitor 240 is charged as the method shown in FIG. 3 is initiated, due to charging during prior burst mode periods.

At a step 304, the switches are set to a default position during burst-off mode. In this embodiment, switch S1 is open, switch S2 is closed, and switch S3 is closed. Establishing switch S1 as open, prevents the charge on the capacitor 240 from passing to ground and thus, the capacitor 240 remains charged. Setting switch S2 to a closed position, shorts any voltage charge across the light source thereby terminating any output from the light source which may otherwise occur after the burst-on transmit period. Optical signal transmission during a burst-off period is unwanted because it interferes with other transmitters.

At a step 308 the system of FIG. 2 waits for, or monitors for, a burst-on period. When to enter burst mode, or active transmit mode, may be defined by a circuit or controller not shown in FIG. 2. Enabling burst-on mode enables or causes the light source 256 to generate an optical signal, such as during a transmit period. A timing circuit or other control element may determine when to enter burst mode. In addition, a burst-off signal, other events, or periods may occur to enable or disable transmission by the light source 256.

At a step 312, the controller receives instructions, such as a trigger signal to initiate a burst-on period. In response, the controller generates switch control signals. At a step 316, the control signal is provided to switch S2 to enable the laser (light source) and a short time thereafter, the controller provides a control signal to switch S1 to close switch S1. Closing switch S1 couples the capacitor and Vdd to the driver. By opening switch S2, a voltage may be established across the light source since thereby enabling operation of the light source subject to the signal from the driver. Forcing switch S1 closed after opening switch S2, prevents the charge stored on the capacitor or charged storage device (element 240 in FIG. 1) from discharging.

Next, at a step 320 the driver receives the modulation input signals from the laser driver, which are the signals to be converted to optical signals by the light source. Accordingly, at step 324 the driver generates the drive signals for the light source according the established principles for the driver and at step 328 the drive signal is presented to the light source which in turn generates the optical signal. The drive signal activation is synchronized with action of switch S2, such that the drive signal follows the same timing rule as switch S2, namely, the drive signal is activated before closing switch S1 during transition from burst off to burst on, and the drive signal is disabled after opening switch S1 during transition from burst on to burst off. The activity of steps 324 and 328 continue for the duration of the burst-on period.

At a step 332 the end of the burst-on period or burst mode is detected or signaled, such that a burst-off signal is provided to the controller to terminate the transmit period. In turn, the controller generates one or more switch control signals. At a step 336, prior to ending or at the time of ending the burst-on period, a control signal is sent to open switch S1. By opening switch S1, any charge accumulated on the capacitor (element 240 in FIG. 2), remains accumulated on the capacitor and does not dissipate. Burst-on mode may be rapidly re-initiated because the capacitor need not charge prior to initiating transmission.

At step 340, to end the burst-on mode and enter burst off mode, and directly after opening of switch S1, switch S2 is closed thereby disabling the light source transmission. By shorting the voltage across the light source with the closing of switch S2, transmission may be immediately stopped, without the delay that might otherwise occur if the voltage driving light source were allowed to dissipate through the light source to ground.

Then, at a step 344, the system monitors for the burst-on period or other instruction to transmit. The process repeats with operation of the driver and light source during burst-on and burst-off modes. Although defined in terms of burst-on and burst-off modes, any type on time frame and off time frame may be used.

The innovation disclosed herein has many benefits over the prior art. One such prior art reference is U.S. Patent Application U.S. 20120201260. The system of this prior art reference does not include the switches (S1, S2, S3) of the present application. In particular, switch S1 is not part of this prior art system and hence the prior art system lacks the benefit provided by the switch in connection with the charge storage device along with the novel methods associated with the switch system. As described above, switch S1 make the transition period to fully active burst-on and burst-off mode shorter because the system does not need to charge/discharge the capacitance C or other charge storage device. The system of U.S. Patent Application U.S. 20120201260 does not address this technical problem (recovering fast in burst mode operation).

In addition, switch S2 allows to completely shunt the laser during (or other optical signal generator) burst off because the laser is shorted, guaranteeing that the laser will not transmit during this period (strict requirement in TDMA systems). As compared to the system of U.S. Patent Application U.S. 20120201260 the solution disclosed herein is more reliable because the prior art does not have a switch that is steering current away from the laser through a differential stage and as a result, the differential stage will leak current during burst-off periods.

In addition, in the system of U.S. Patent Application U.S. 20120201260 the termination resistance on cathode side (R2) is parallel to the ferrite L2 in the prior art solution whereas the termination resistance as disclosed herein is in series with the capacitance and the switch S1. The solution disclosed herein better isolates the capacitance of the larger bias source from the laser.

Also, the system disclosed in U.S. Patent Application U.S. 20120201260 does not control VCC voltage whereas the present innovation does control the supply voltage Vcc. Vcc control make the output transistors (in particular Q2) operate in a safe region resulting in no breakdown. Other benefits over the prior art are also provided by the present innovation.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. An optical signal module including a driver, the module comprising:
    a driver including:
        a differential pair include a first transistor configured to receive a first input signal and a second transistor configured to receive a second input signal, the first signal and the second signal being a differential input signal, the differential pair configured to supply a first drive signal and a second drive signal in response to the first input signal and the second input signal;
        a modulation current source providing a modulation current to the differential pair;
        one or more termination elements connected to the differential pair;
        a first switch, responsive to a first control signal, having a first terminal and a second terminal, the first terminal connected to at least one of the one or more termination elements;
        a charge storage device connected to the second terminal of the first switch and a supply voltage node;
        an optical signal module including an optical signal generator arranged between the supply voltage node and a bias current node, the optical signal generator receiving the first drive signal and a second drive signal to generate an optical signal representing the first input signal and the second input signal, wherein the charge storage device and the first switch are configured to prevent dissipation of charge on the charge storage device during periods when the optical signal module is not generating an optical signal; and
        a second switch configured between a supply voltage node and the bias current node, the second switch, responsive to second control signal, configured to establish a short between the supply voltage node and the bias current node.

2. The module of claim 1 further comprising a first inductor located between the optical signal generator and the supply voltage node and a second inductor located between the optical signal generator and the bias current node.

3. The module of claim 1 wherein the optical signal generator is a laser diode.

4. The module of claim 1 wherein the first control signal and second control signal are generated by a controller responsive to a burst on signal or a burst off signal.

5. The module of claim 4 wherein responsive to a burst on signal, the second control signal opens the second switch and thereafter the first control signal closes the first switch.

6. The module of claim 5 wherein responsive to a burst off signal, the first control signal opens with first switch to thereby maintain charge on the charge storage device, and thereafter the second control signal closes the second switch.

7. The module of claim 1 wherein the charge storage device is a capacitor.

8. The module of claim 1, further including a cascade transistor located between one of the termination elements and the differential pair.

9. A method for driving an optical signal generator with a driver comprising:
    providing:
        a driver configured to amplify at least one input signal to create a drive signal;
        a first switching element, in series with a resistance, the first switch located between a supply voltage node and the driver, the first switch responsive to an activation control signal and a de-activation control signal;
        a charge storage device located between the supply voltage node and the first switch;
        an optical signal generator receiving the drive signal and responsive to the drive signal generating an optical signal;
        a second switching element associated with the optical signal generator, the second switch responsive to the activation control signal and the de-activation control signal to selectively short voltage across the optical signal generator through the switch;
    receiving a one or more input signals;
    receiving a supply voltage from a supply voltage node;
    receiving an activation signal to initiate a transmit period for the optical signal generator;
    responsive to the activation signal, generating the activation control signal;
    providing the activation control signal to the second switching element to open the second switching element;
    providing the activation control signal to the first switch to close the first switching element;
    amplifying the input signal with the driver to generate a drive signal representative of the input signal;
    receiving a de-activation signal to terminate a transmit period for the optical signal generator;
    responsive to the de-activation signal, generating the de-activation control signal;
    providing the de-activation control signal to the first switching element to open the first switching element; and
    providing the de-activation control signal to the second switching element to close the second switching element.

10. The method of claim 9 wherein the activation signal to initiate a transmit period is a burst-on signal.

11. The method of claim 9 wherein responsive to the activation control signal the second switching element is opened before the first switching element is closed.

12. The method of claim 9 wherein responsive to the de-activation control signal the first switching element is opened before the second switching element is closed.

13. The method of claim 9 wherein the one or more inputs signals comprise two input signals presented as a differential pair.

14. The method of claim 9 further comprising impedance matching the driver to the optical signal generator with one or more termination elements, the one or more termination elements being in series with the first switching element and the charge storage device.

15. The method of claim 9 wherein closing the second switching element shorts voltage across the optical signal generator thereby terminating the optical signal generation and opening the first switching element maintains charge on the charge storage device during periods when the optical signal generator is not generating an optical signal.

* * * * *